United States Patent
Sakiyama et al.

(10) Patent No.: US 6,462,427 B2
(45) Date of Patent: Oct. 8, 2002

(54) SEMICONDUCTOR CHIP, SET OF SEMICONDUCTOR CHIPS AND MULTICHIP MODULE

(75) Inventors: Shiro Sakiyama, Osaka (JP); Jun Kajiwara, Kyoto (JP); Masayoshi Kinoshita, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/024,721

(22) Filed: Dec. 21, 2001

(65) Prior Publication Data
US 2002/0079591 A1 Jun. 27, 2002

(30) Foreign Application Priority Data
Dec. 22, 2000 (JP) ......................... 2000-390455

(51) Int. Cl.$^7$ ............................ H01L 29/40; H01L 23/28
(52) U.S. Cl. .................. 257/786; 257/778; 257/723; 257/787
(58) Field of Search ..................... 257/786, 778, 257/666, 787, 723; 438/612, 666

(56) References Cited

U.S. PATENT DOCUMENTS

| | | | | |
|---|---|---|---|---|
| 5,528,083 A | * | 6/1996 | Malladi et al. | 257/786 |
| 5,801,447 A | * | 9/1998 | Hirano et al. | 257/778 |
| 6,108,210 A | * | 8/2000 | Chung | 361/747 |
| 6,121,690 A | * | 9/2000 | Yamada et al. | 257/784 |
| 6,365,436 B1 | * | 4/2002 | Faraci et al. | 438/113 |

FOREIGN PATENT DOCUMENTS

| | | | | |
|---|---|---|---|---|
| JP | 402100353 A | * | 4/1990 | 257/688 |
| JP | 9-298217 | * | 11/1997 | H01L/21/60 |
| JP | 2000-223657 | | 8/2000 | |

* cited by examiner

Primary Examiner—Jasmine J B Clark
(74) Attorney, Agent, or Firm—McDermott, Will & Emery

(57) ABSTRACT

Each bare-chip IP includes pad electrodes that are of the same size and shape, made of the same material, and arranged in an array at the same pitch over almost the entire surface thereof. A silicon wiring substrate includes pad electrodes that are arranged in an array over almost the entire surface thereof at the same pitch as that between the pad electrodes of the bare-chip IPs. The bare-chip IPs are mounted on the silicon wiring substrate, thereby making a multichip module.

12 Claims, 4 Drawing Sheets

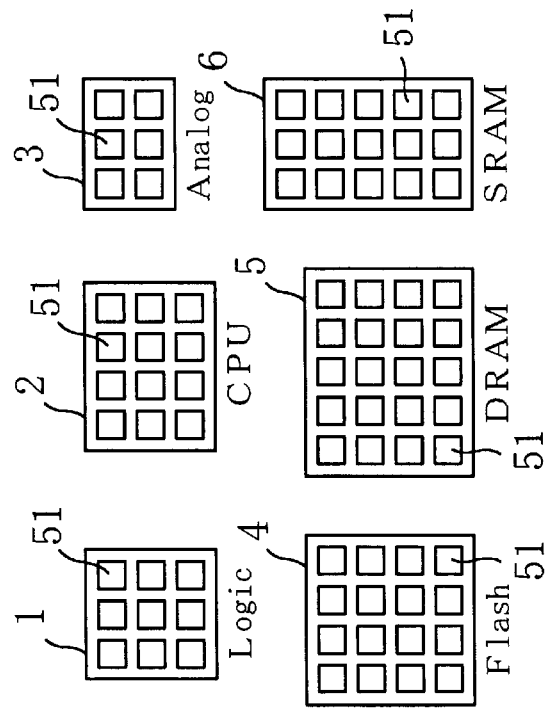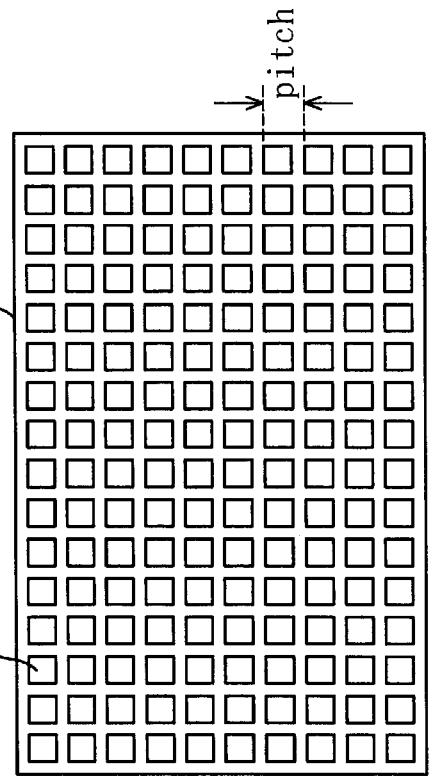

SEMICONDUCTOR CHIP, SET OF SEMICONDUCTOR CHIPS AND MULTICHIP MODULE

BACKGROUND OF THE INVENTION

The present invention relates to a chip-on-chip multichip module in which a plurality of chips are mounted on a chip as a substrate including pad electrodes; the substrate chip included in the module, and the chips mounted on the substrate chip.

Recently, a "single-chip system LSI", that is, an LSI with a multiplicity of functions integrated together within a single chip, has been introduced and various design techniques have been proposed for the single-chip system LSI. In particular, an advantage of the single-chip system LSI is that a high-performance multifunction device is realized with a multiplicity of functions such as memories of, e.g., a dynamic random access memory (DRAM) and a static random access memory (SRAM) and circuits of, e.g., logic and analog circuits, integrated within a single semiconductor chip. However, in realizing such a system LSI, i.e., in fabricating a device with a multiplicity of functions, the following problems have been encountered.

One of the problems is that, when a system LSI develops to a higher degree, the cost of fabricating a device increases because a greater power is required and production yield decreases due to increase in total chip area.

Another problem is that it is difficult to combine a process for embedding mutually different types of devices such as a DRAM and a flash memory (FLASH) together with a pure CMOS process. This is because it is very difficult for a process performed on a device with a particular function and the pure CMOS process to have the same progress of development. Thus, the development of a process for embedding mutually different types of devices together is lacking a year or 2, behind that of the pure CMOS process using the cutting-edge skills. As a result, the production cannot meet the needs on the market timely.

To solve the problems, a chip-on-chip system LSI using a module including a plurality of chips was proposed in Japanese Laid-Open Publication No. 58-92230. In this chip-on-chip multichip module, pad electrodes formed on the upper surface of a chip as a substrate (i.e., a mother chip) are connected to respective pad electrodes formed on the upper surface of each chip to be mounted (i.e., daughter chip) with bumps. These chips are bonded and electrically connected to each other, thereby making a module including a plurality of chips. Unlike a single-chip system LSI, in the chip-on-chip multichip module, a multiplicity of functions are incorporated into a plurality of chips separately. Thus, it is possible to reduce the scale of each chip, and to increase the yield thereof. In addition, the module can also easily include mutually different types of devices that are also different in process generation. As a result, the resultant device is easily implemented as a multifunction device. Furthermore, in a system LSI that utilizes a chip-on-chip multichip module, each wire length required for communication between the mother and daughter chips is extremely short compared to a technique using other multichip modules. Therefore, high-speed communication can be obtained, and thus realizing communication equal to that between blocks in a known single-chip system LSI.

Thus, the chip-on-chip multichip module is an important technique replacing the known single-chip system LSI, but involves the following problems.

A first problem is that the cost of connecting the chips together increases. In general, to connect chips together, bumps are formed on pad electrodes of each chip, and then daughter chips are bonded onto a mother chip so that the chips are connected to each other. However, if the pad electrodes are different in shape or arrangement between the daughter chips, different photomasks for forming the bumps need to be made individually with respect to different daughter chips and the mounting process needs to be changed with respect to each different daughter chip. As a result, the mounting cost invariably increases.

A second problem is that, in making a module, the sufficient bonding strength between chips cannot be ensured. For example, in connecting the chips to each other, if an insufficient number of pad electrodes are formed or a great number of pad electrodes are biasedly arranged near a particular side of a chip bonding strength between chips is excessively decreased.

A third problem is that an insufficient voltage is applied from the mother chip to the daughter chips. In general, according to the shrinkage of design rules for downsizing an element included in an LSI, a device also has its height decreased. Then, the cross-sectional area of wires decreases and the sheet resistance thereof increases. Accordingly, in fabricating a mother chip by a downsizing process using the cutting-edge skills, a power source line needs to be made thicker than in a process using older skills. As a result, the downsized element involves drawbacks.

A fourth problem is that wiring delay increases when signals are transmitted among daughter chips. In a multichip module where a plurality of daughter chips are bonded onto a mother chip, signals are transmitted between the daughter chips via wiring formed on the mother chip. Thus, imped-ance matching of signal lines formed on the mother chip greatly affects communication efficiency among the daughter chips. As a result, because of the increases in sheet resistance of the wiring and in wiring capacitance due to the downsizing, signals are transmitted between the daughter chips at a lower speed.

A fifth problem is that it is difficult to ensure flexibility in designing because the relationship between the total chip area of the mother chip and that of daughter chips has limitations. In general, input and output of signals between a multichip module and external devices are performed via the mother chip. Thus, when a plurality of daughter chips are bonded onto the mother chip, the mother chip requires an area for bonding the daughter chips thereto and an area for disposing I/O parts for inputting and outputting signals to the external devices. That is to say, relationship between the total chip area of the mother chip and that of the daughter chips reduces the flexibility in designing a chip-on-chip multichip module.

SUMMARY OF THE INVENTION

It is therefore an object of the present invention to provide a high-performance chip-on-chip multichip module, chip as a substrate, and set of chips that are mounted on the chip, with low cost and high flexibility in designing.

Specifically, an inventive set of small semiconductor chips is mounted on a large chip including a plurality of pad electrodes. Each of the small semiconductor chips includes, on its face, a plurality of pad electrodes that are arranged in an array. The pad electrodes of the small semiconductor chips are of a same size and a same shape, arranged at a same pitch, and made of a same material. The pitch is equal to a pitch between the pad electrodes of the large chip.

In the set of small semiconductor chips, the pad electrodes of all the small semiconductor chips are of the same size and shape, arranged at the same pitch, and made of the same material. Thus, the process steps of simultaneously mounting the small semiconductor chips onto the large chip can be easily performed. For example, the same photomask can be used to form bumps during the mounting process steps for making a module. As a result, the small semiconductor chips to be mounted are effective for making a multichip module at a low cost.

In one embodiment of the present invention, each of the small semiconductor chips may further include an internal circuit. Part of the pad electrodes of each of the small semiconductor chips may be electrically connected to the internal circuit. At least one of the pad electrodes, other than the part of the pad electrodes, may be electrically isolated from the internal circuit in each of the small semiconductor chips. Then, the resultant multichip module has a sufficient bonding strength. In addition, since the pad electrodes that require no electrical connection are electrically isolated from the internal circuit in each of the small chips, no electrical error occurs.

In another embodiment, the pad electrodes may be of a same size and arranged at a same pitch so that the size and the pitch is each standardized to take a discrete value. Then, the variety of photomasks used to form bumps during the mounting process steps for making a module can be minimized. As a result, the mounting cost can be further reduced.

In still another embodiment, the set of small semiconductor chips may include at least one element selected from the group consisting of a chip capacitor, a chip resistor, and a chip inductor. In such a case, if the pad electrodes of the chip capacitor, chip resistor, and chip inductor are of the same shape and arranged at the same pitch as the pad electrodes formed in an array on each of the small chips, these components can be mounted in any location on the large chip of a substrate. As a result, it is possible to select components freely and to design the chip more flexibly.

An inventive large semiconductor chip on which a plurality of small chips, each including a plurality of pad electrodes, are mounted. The large semiconductor chip includes, on its face, a plurality of pad electrodes that are arranged in an array. The pad electrodes of the large semiconductor chip are of a same size and a same shape, arranged at a same pitch, and made of a same material. The pitch is equal to a pitch between the pad electrodes of each of the small chips. The large semiconductor chip is a substrate that is used only for forming interconnects and includes no semiconductor element.

In the large semiconductor chip, the pad electrodes of the large semiconductor chip are of the same size and shape and the same material and the pitch between the pad electrodes of the large semiconductor chip is equal to a pitch between the pad electrodes formed on each of the small chips. Thus, the process steps of simultaneously mounting the small chips onto the large chip can be easily performed. Therefore, the large chip is usable for making a multichip module at a low cost. In addition, since the large chip is made of a semiconductor material, this large chip shows the same thermal expansion coefficient as that of the small chips. Thus, a highly reliable multichip module is realized by using this large semiconductor chip as a substrate. Since the large semiconductor chip is a substrate that is used only for forming interconnects therein and includes no semiconductor element, the process steps of fabricating the large semiconductor chip on which the small chips are mounted can be simplified. As a result, the fabricating cost is reduced and the development is accelerated. Further, by using this large semiconductor chip used only for forming interconnects, it is possible to eliminate drawbacks such as deterioration in a power source impedance and increase in wiring delay. Moreover, since the large semiconductor chip of S the substrate includes no semiconductor element such as a transistor, the production yield is expected to be close to 100%. In some cases, testing the substrate chips for shipping can be simplified, thus further reducing the fabricating cost. The absence of a semiconductor element allows the large semiconductor chip of the substrate to be designed so as to have only a minimum area required for making a module. As a result, it is possible to select small chips to be mounted more freely and to design the chips more flexibly. The large semiconductor chip of the substrate used only for forming interconnects does not need to have a microscopic pattern. Thus, it is possible to use an existing semiconductor process of an older generation, thus further reducing the cost of fabricating a substrate chip.

In one embodiment of the present invention, the large semiconductor chip may further include: a ground layer; a power source layer; at least one wiring layer for transmitting signals; a pad electrode layer where the pad electrodes are arranged; and a semiconductor substrate. The ground, power source, wiring, and pad electrode layers may be formed over the semiconductor substrate with an insulating layer each interposed therebetween. The ground layer may be formed over almost the entire surface of the semiconductor substrate. Then, the ground and power source layers have low impedances, thus making a multichip module made up of chips more easily. Also, since the cost of patterning the ground layer is not needed, the cost of fabricating a wiring substrate (i.e., a substrate chip) can be further reduced.

An inventive multichip module includes: a large chip; and a set of small chips mounted on the large chip. Each of the large chip and the small chips includes, on its face, a plurality of pad electrodes that are arranged in an array. The pad electrodes of the large chip are of a same size and a same shape, arranged at a same pitch, and made of a same material. The pad electrodes of the small chips are of a same size and a same shape, arranged at a same pitch, and made of a same material. The pitch is equal to a pitch between the pad electrodes of the large chip.

In the multichip module, as described above, the process step of simultaneously mounting the small chips onto the large chip can be easily carried out to make the module. As a result, the multichip module can be made at a low cost.

In one embodiment of the present invention, each of the small chips may include an internal circuit. Part of the pad electrodes may be electrically connected to the internal circuit in each of the small chips. At least one of the pad electrodes, other than-the part of the pad electrodes, may be electrically isolated from the internal circuit in each of the small chips. Then, a highly reliable multichip module with a sufficient bonding strength is realized.

In another embodiment, the pad electrodes of the large chip and the small chips are preferably of a same size and arranged at a same pitch so that the size and the pitch is each standardized to take a discrete value.

In still another embodiment, the large chip is preferably a substrate that is used only for forming interconnects and includes no semiconductor element.

In yet another embodiment, the large chip preferably further includes: a ground layer; a power source layer; at least one wiring layer for transmitting signals; a pad electrode layer where the pad electrodes are arranged; and a semiconductor substrate. The ground, power source, wiring, and pad electrode layers are preferably formed over the semiconductor substrate with an insulating layer each interposed therebetween. The ground layer is preferably formed over almost the entire surface of the semiconductor substrate.

In still another embodiment, the set of small chips may include at least one element selected from the group consisting of a chip capacitor, a chip resistor, and a chip inductor.

BRIEF DESCRIPTION OF THE DRAWINGS

FIGS. 1A, 1B and 1C are plan views of an IPOS device; bare-chip IPs; and a silicon wiring substrate, respectively, as according to an embodiment of the present invention.

DESCRIPTION OF THE PREFERRED EMBODIMENTS

Basic Structure as a Premise of the Present Invention

One of the most preferable embodiments of a chip-on-chip multichip module according to the present invention has a structure in which a silicon wiring substrate (Super-Sub) that is made only for forming interconnections is employed as a substrate chip, and a plurality of chips (chips to be mounted), including a multiplicity of functions, are mounted on the silicon wiring substrate. The respective chips to be mounted can be treated as different IPs (Intellectual Properties) in designing, according to their functions. Thus, these chips will be herein referred to as bare-chip IPs, which are bonded onto the Super-Sub. The silicon wiring substrate does not include any semiconductor element such as a transistor but includes interconnections and pad electrodes. That is to say, the entire semiconductor device has a structure of an "IP On Super-Sub". Thus, the entire multichip module including the silicon wiring substrate and the bare-chip IPs will be herein referred to as an "IPOS device".

Embodiment of Structure

FIGS. 1A, 1B and 1C are plan views of an IPOS device, which includes bare-chip IPs; the bare-chip IPs, which is mounted on a silicon wiring substrate; and the silicon wiring substrate, respectively, as according to an embodiment of the present invention.

As shown in FIG. 1A, in the IPOS device of this embodiment, bare-chip IPs 1 through 6 are connected to a silicon wiring substrate 100 and the bare-chip IPs 1 through 6 are electrically connected to one another, thereby making a module. In other words, the IPOS device is a multichip module. As shown in FIG. 1A, the silicon wiring substrate 100 has a plurality of regions on which the bare-chip IPs 1 through 6 are mounted. The bare-chip IPs 1 through 6 such as Logic-IP, CPU-IP, Analog-IP, Flash memory-IP, SRAM-IP and DRAM-IP, shown in FIG. 1B, can respectively be mounted on the regions. That is to say, the IPOS device has a structure in which pad electrodes 26 formed on the silicon wiring substrate 100 are connected to respective pad electrodes 51 formed on the bare-chip IPs 1 through 6.

Figure 2:
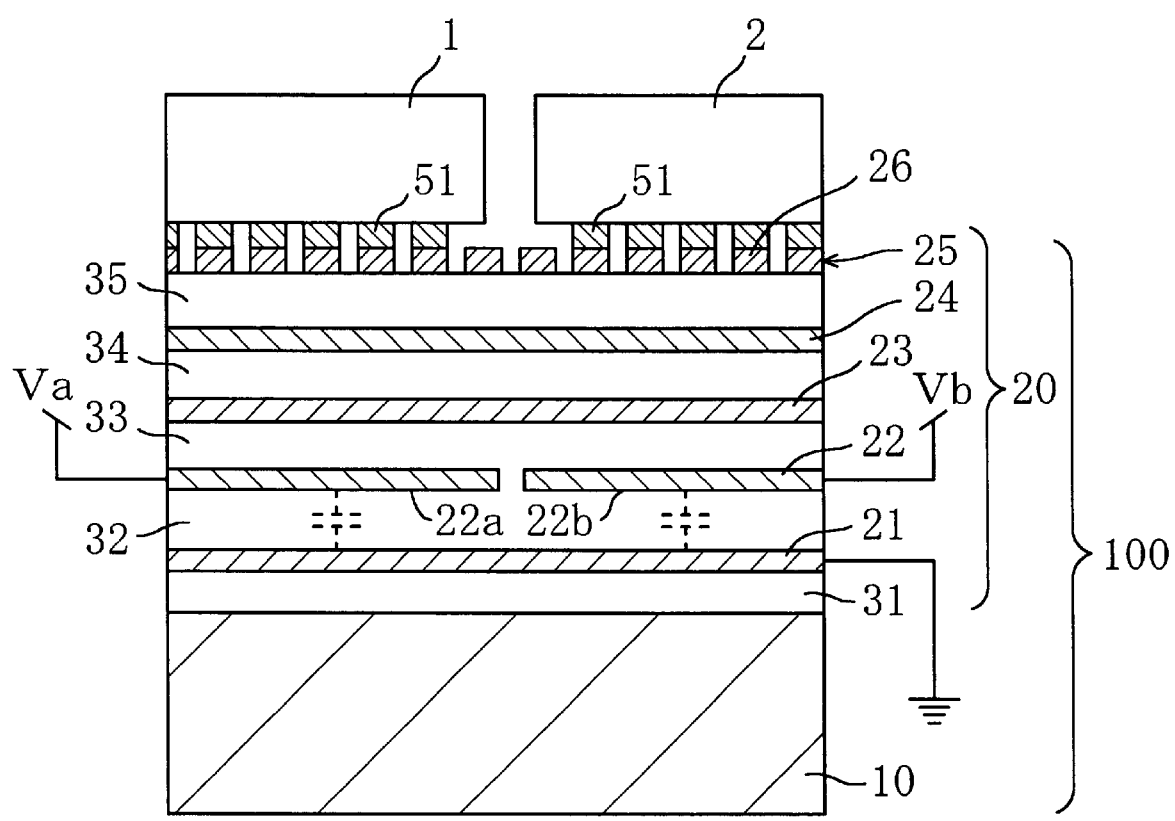
FIG. 2 is a cross-sectional view of part of the IPOS device shown in FIG. 1A.

FIG. 2 is a cross-sectional view of part of the IPOS device shown in FIG. 1A. FIG. 2 shows the part where the bare-chip IPs 1 and 2 are mounted on the silicon wiring substrate 100.

As shown in FIG. 2, the silicon wiring substrate 100 includes a p-silicon substrate 10 and a multilevel interconnect layer 20 formed on the silicon substrate 10. The multilevel interconnect layer 20 includes: first insulating film 31; ground plane 21; second insulating film 32; power source plane layer 22; third insulating film 33; first wiring layer 23; fourth insulating film 34; second wiring layer 24; fifth insulating film 35; and pad electrode layer 25. The first insulating film 31 is formed on the silicon substrate 10. The ground plane 21 is formed on the first insulating film 31. The second insulating film 32 is formed on the ground plane 21. The power source plane layer 22 is formed on the second insulating film 32. The third insulating film 33 is formed on the power source plane layer 22. The first wiring layer 23 is formed on the third insulating film 33. The fourth insulating film 34 is formed on the first wiring layer 23. The second wiring layer 24 is formed on the fourth insulating film 34. The fifth insulating film 35 is formed on the second wiring layer 24. The pad electrode layer 25 is formed on the fifth insulating film 35 and includes a large number of pad electrodes 26 that are arranged in an array. The silicon wiring substrate 100 does not include any semiconductor element such as a transistor but includes contacts so as to connect wiring formed on each of the wiring layers 21 through 24 to the pad electrodes 26. That is to say, wiring and a pad electrode are connected together via a contact. Since the pad electrodes 26 of the pad electrode layer 25 in the silicon wiring substrate 100 are bonded onto the respective pad electrodes 51 of each bare-chip IP via bumps, semiconductor elements such as transistors formed in the respective bare-chip IPs are electrically connected to each other via the multilevel interconnect layer 20.

In this embodiment, as shown in FIG. 1B, the pad electrodes 51 of the bare-chip IPs 1 through 6 have the same size and shape (e.g., a square) and are made of the same material (e.g., aluminum). Thus, the process steps of simultaneously mounting the bare-chip IPs onto the silicon wiring substrate 100 to make a module can be easily performed. As a result, the cost of fabricating the IPOS device can be reduced in total. If the pad electrodes of the bare-chip IPs have various sizes or shapes or are made of various materials, the process for forming the bumps on the pad electrodes and the pressure required for bonding the bare-chip IPs to the substrate need to be changed according to the types of the bare-chip IPs. As a result, the mounting cost for making a module increases.

In addition, the pad electrodes 51 are arranged in an array over almost the entire surface of each of the bare-chip IPs 1 through 6 in this embodiment. Thus, the entire surface of each of the bare-chip IPs can be connected to the silicon wiring substrate. As a result, it is possible to provide a highly reliable multichip module having a sufficient bonding strength between each chip and a substrate.

As shown in FIG. 1B, the pitch between the pad electrodes 51 is preferably the same for all of the bare-chip IPs 1 through 6. Since the bare-chip IPs have the same pitch between the pad electrodes 51, the bare-chip IPs can share the same photomask for forming bumps when mounted on the substrate to make a module. As a result, mounting cost can be further reduced. In this embodiment, the pitch between the pad electrodes 51 ranges from about 30 $\mu$m to about 80 $\mu$m. For example, if the pitch is 50 $\mu$m, 400 pad electrodes 51 are formed per 1 $mm^2$, thus ensuring a sufficient number of pad electrodes for practical use.

If the pitch between the pad electrodes 51 is the same among the bare-chip IPs, fabrication of the silicon wiring substrate 100 as a substrate chip has the following advantages. Specifically, the pad electrodes 26 can be arranged in an array at a predetermined pitch over almost the entire surface of the silicon wiring substrate 100. Accordingly, in fabricating a plurality of multichip modules, the process steps of simultaneously patterning the electrode layers can be performed to form the pad electrodes 51 for the silicon wiring substrates 100. As a result, the cost of fabricating the silicon wiring substrates 100 can be reduced.

As shown in FIG. 1C, since the pad electrodes 26 are regularly arranged in an array on the silicon wiring substrate 100, areas of the substrate onto which the bare-chip IPs are bonded can be specified using coordinates. As a result, the IPOS device can be designed more easily.

In addition, since the semiconductor chip, i.e., the silicon wiring substrate, is used only for forming interconnections, this semiconductor chip can be designed to have its size as small as possible according to the sizes of the bare-chip IPs to be mounted thereon. In a situation where a silicon wiring substrate includes transistors, the selection of bare-chip IPs has limitations. However, since the semiconductor chip is used only for forming interconnections, it is possible to select bare-chip IPs freely and to design the chips more flexibly.

Instead of the silicon substrate 10 shown in FIG. 2, a substrate made of, for example, a glass, a metal or any other semiconductor material may be used. However, a silicon substrate has advantages. For example, an existing old semiconductor process can be applied without modification. In addition, the resultant module is implementable as a highly reliable multichip module, which shows the same thermal expansion coefficient as that of bare-chip IPs made of silicon and thus hardly deforms.

In this embodiment, the ground plane 21 and power source plane layer 22 shown in FIG. 2 are made of Al (aluminum) alloy films, each of which has a thickness of several $\mu$m. Alternatively, the ground plane 21 and power source plane layer 22 may be made of Cu (copper), W (tungsten) or Ti (titanium). In particular, if the Al alloy film has a thickness of about 10 $\mu$m, the impedance of the ground plane 21 and power source plane layer 22 can be reduced to about 5 mΩ. As a result, power source noise can be further reduced, and the bare-chip IPs can be mounted on the substrate more easily. It is preferable for the second insulating film 32 interposed between the ground plane 21 and power source plane layer 22 to be thin and made of a material with a high dielectric constant. Then, the capacitance between the ground plane 21 and power source plane layer 22 increases, thus suppressing power source noise.

FIG. 2 also shows two wiring layers, i.e., the first and second wiring layers 23 and 24, as well as the ground plane 21 and power source plane layer 22. Alternatively, more than two wiring layers or only one wiring layer may be provided. In FIG. 2, the first and second wiring layers 23 and 24 are shown as a continuous film. However, each of the layers 23 and 24 actually includes wiring that is patterned as lines. The wiring formed on each of the wiring layers 23 and 24 includes: wires connected to the pad electrodes arranged at a pitch of about 50 $\mu$m; and wires for I/O parts connected to the external devices located outside of the multichip module. Thus, the wiring layers 23 and 24 are not strictly limited in size, and thus may be patterned using a design rule in which wires are provided at a pitch from several $\mu$m to several tens of $\mu$m. In such a pattern layout, it is possible not only to use a semiconductor process of older generations but also to provide a silicon wiring substrate with low impedance wires and good production yield.

In addition, each of the insulating film 33 interposed between the first wiring layer 23 and power source plane layer 22, insulating film 34 interposed between the first and second wiring layers 23 and 24, and insulating film 35 interposed between the second wiring layer 24 and pad electrode layer 25, shown in FIG. 2, is preferably made of an insulating film with a low dielectric constant and a relatively large thickness. In such a case, a parasitic capacitance between wires decreases, thus obtaining high-speed communication between bare-chip IPs.

Though not shown in FIG. 2, contacts are formed through the insulating films 33, 34 and 35 so as to establish electrical connection between the wiring layers 23 and 24 or between the wiring layer 23 or 24 and the pad electrode layer 25. These contacts will be described later.

Embodiment of Bonding

Figure 3:
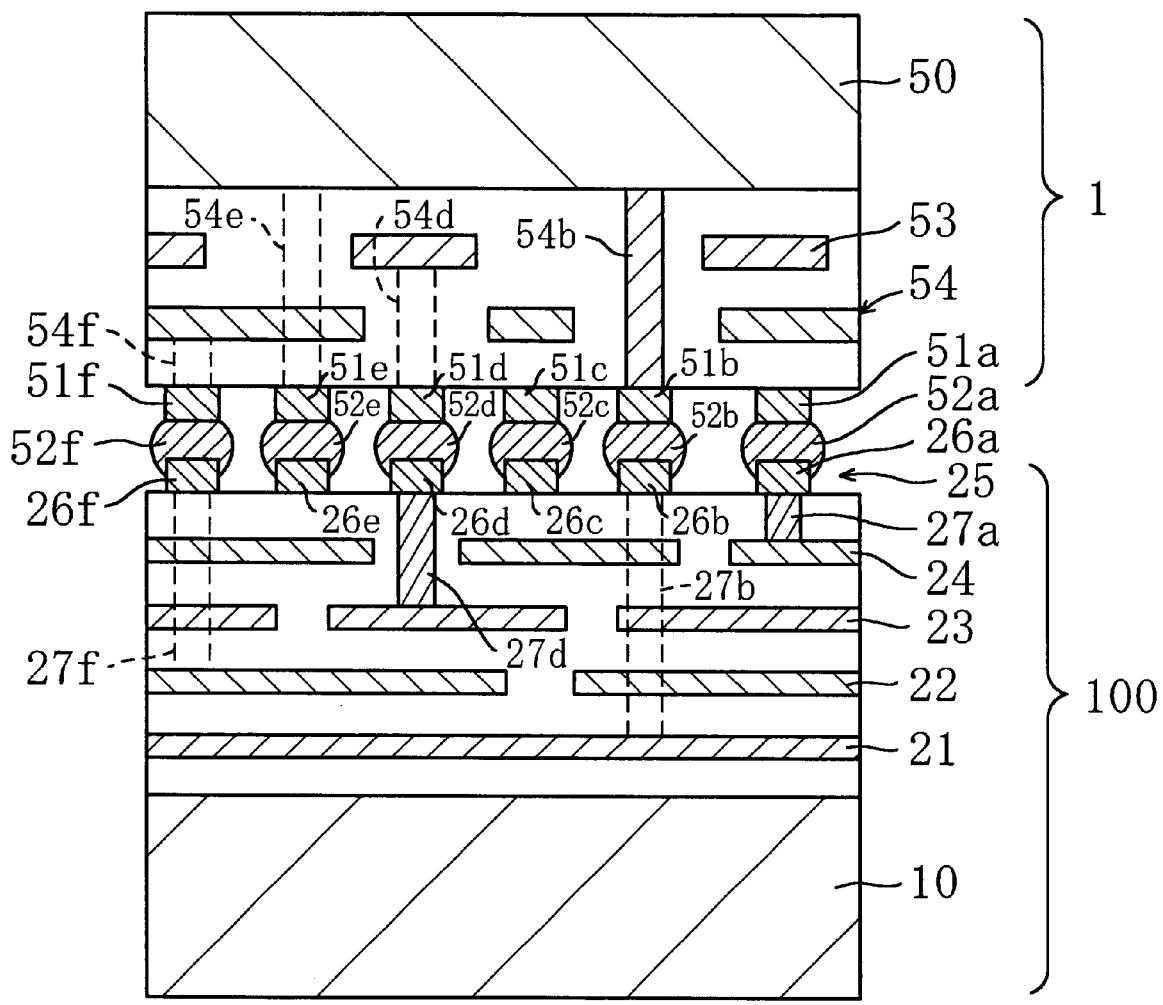
FIG. 3 is a cross-sectional view showing the structure of bonding between pad electrodes formed on a silicon wiring substrate and pad electrodes formed on a bare-chip IP.

FIG. 3 is a cross-sectional view showing the structure of bonding between pad electrodes formed on a silicon wiring substrate and pad electrodes formed on a bare-chip IP. FIG. 3 shows only part of the connection between one of the bare-chip IPs and the silicon wiring substrate 100. As shown in FIG. 3, the pad electrodes 26 of the silicon wiring substrate 100 and the pad electrodes 51 formed on the principal surface of the bare-chip IP 1 are bonded together with bumps 52. The bare-chip IP 1 includes: a semiconductor substrate 50 where semiconductor elements (not shown) such as transistors are formed; and first and second wiring layers 53 and 54 formed over the semiconductor substrate 50. The semiconductor elements and the wiring layers 53 and 54 together constitute an internal circuit. As shown in FIG. 3, in connecting the silicon wiring substrate 100 and the chip IP 1 together, there are various ways of connection between the pad electrodes, between a pad electrode and wiring, and between a pad electrode and the internal circuit, for example.

In the silicon wiring substrate 100, a pad electrode 26a and the wiring of the second wiring layer 24 are connected together via a plug (i.e., a contact) 27a. On the other hand, in the bare-chip IP 1, a pad electrode 51a, which is connected to the pad electrode 26a of the silicon wiring substrate 100 via a bump 52a, is not connected to the internal circuit of the bare-chip IP 1. That is to say, the bare-chip IP 1 includes no plug for the pad electrode 51a.

In the silicon wiring substrate 100, a pad electrode 26b is connected to the ground plane 21 (not shown in FIG. 3 but can be shown in a cross section cut in a different way). On the other hand, in the bare-chip IP 1, a pad electrode 51b, which is connected to the pad electrode 26b of the silicon wiring substrate 100 via a bump 52b, is connected to the semiconductor substrate 50 via a plug 54b. That is to say, the pad electrode 51b is connected to the internal circuit of the bare-chip IP 1.

In the silicon wiring substrate 100, a pad electrode 26c is not connected to any of the ground plane 21, power source plane layer 22 and wiring layers 23 and 24. Similarly, in the bare-chip IP 1, a pad electrode 51c, which is connected to the pad electrode 26c of the silicon wiring substrate 100 via a bump 52c, is not connected to the internal circuit of the bare-chip IP 1.

In the silicon wiring substrate 100, a pad electrode 26d is connected to the first wiring layer 23 via a plug 27d. On the other hand, in the bare-chip IP 1, a pad electrode 51d, which is connected to the pad electrode 26d of the silicon wiring substrate 100 via a bump 52d, is connected to the first wiring layer 53 of the bare-chip IP 1 via a plug 54d. That is to say, the pad electrode 51d is connected to the internal circuit of the bare-chip IP 1.

In the silicon wiring substrate 100, a pad electrode 26e is not connected to any of the ground plane 21, power source plane layer 22 and wiring layers 23 and 24. On the other hand, in the bare-chip IP 1, a pad electrode 51e, which is connected to the pad electrode 26e of the silicon wiring substrate 100 via a bump 52e, is connected to the semiconductor substrate 50 of the bare-chip IP 1 via a plug 54e. That is to say, the pad electrode 51e is connected to the internal circuit of the bare-chip IP 1, while the pad electrode 26e is not connected to any of the wiring layers of the silicon wiring substrate 100.

In the silicon wiring substrate 100, a pad electrode 26f is connected to the power source plane layer 22 via a plug 27f. On the other hand, in the bare-chip IP 1, a pad electrode 51f, which is connected to the pad electrode 26f of the silicon wiring substrate 100 via a bump 52f, is connected to the second wiring layer 54 of the bare-chip IP 1 via a plug 54f. That is to say, the pad electrode 51f is connected to the internal circuit of the bare-chip IP 1.

As described above, the pad electrodes 51 of each of the bare-chip IPs 1 through 6 include the dummy pad electrodes 51a and 51c, which are not electrically connected to the internal circuit of the bare-chip IP and ensure sufficient mechanical strength. These dummy pad electrodes 51a and 51c are connected to the pad electrodes 26a and 26c of the silicon wiring substrate 100 via the bumps 52a and 52c but electrically isolated from the internal circuit of each of the bare-chip IPs 1 through 6. Due to the existence of the dummy pad electrodes 51a and 51c, bonding strength between the chip and substrate increases, and reliability of connection improves. For example, in some of the bare-chip IPs 1 through 6, pad electrodes 51 that require electrical connection may be arranged near only a particular side of the chip. In such a case, since the dummy pad electrodes are provided near the other sides or the center of the chip to ensure sufficient mechanical strength, the mechanical bonding strength between the chip and substrate can be enhanced. Accordingly, reliability of the electrical connection between the chip and substrate or between chips improves. Moreover, these dummy pad electrodes do not contribute to electrical connection between the chip and substrate or between chips. Thus, the dummy pad electrodes do not lead to an electrical error.

As the pad electrodes 51 of the bare-chip IPs 1 through 6, the pad electrodes 26 of the silicon wiring substrate 100 include the dummy pad electrodes 26c and 26e that are not connected to any of the wirings in the substrate. These dummy pad electrodes improves mechanical bonding strength between a chip and the substrate. Since these dummy pad electrodes do not contribute to electrical connection between the chip and substrate or between chips, the dummy pad electrodes do not lead to an electrical error.

In designing a multichip module, patterns of pad electrodes are predetermined to be in an array. Then, connections between the pad electrodes and an internal circuit are determined, using a mask pattern, with respect to the function of a bare-chip IP based on the design specifications. Thereafter, interconnections and the size of a silicon wiring substrate to be processed, for example, are designed.

In addition, in the structure shown in FIG. 3, the pad electrodes 26a through 26f of the silicon wiring substrate 100 are electrically connected to the pad electrodes 51a through 51f of the bare-chip IP 1 via the bumps 52a through 52f, respectively. However, the present invention is not limited to this embodiment. For example, some pairs of pad electrodes may be electrically isolated from each other.

Embodiment of Packaging

Figure 4:
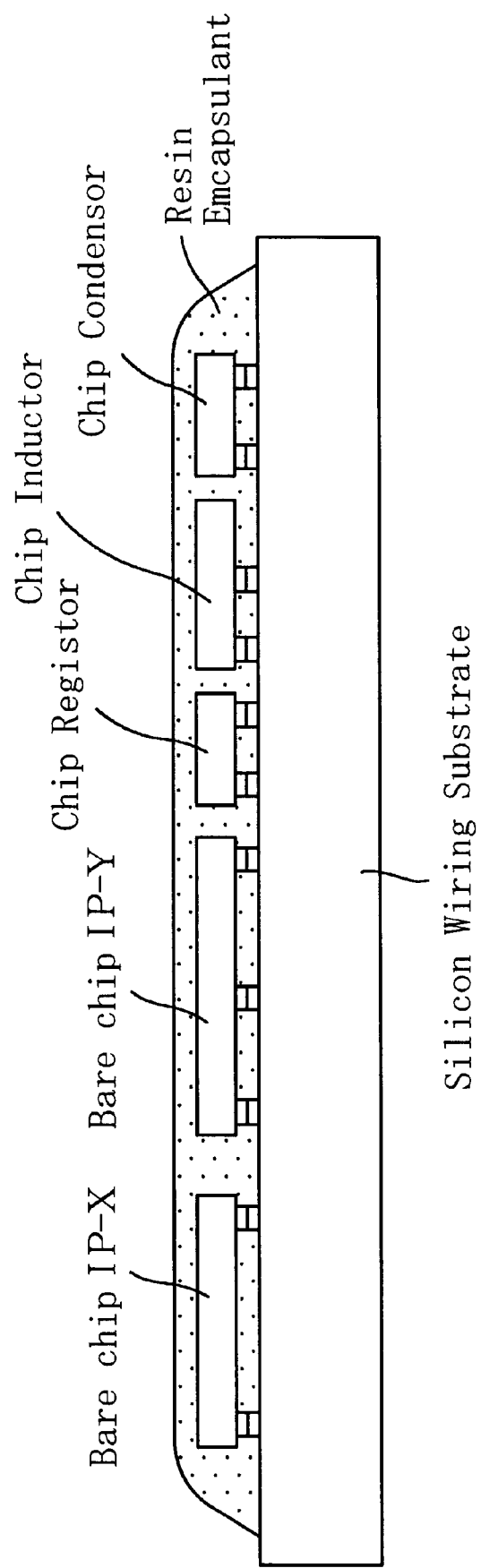
FIG. 4 is a cross-sectional view illustrating an example of a resin-molded IPOS device.

FIG. 4 is a cross-sectional view illustrating an example of a resin-molded IPOS device. As shown in FIG. 4, bare-chip IPs such as IP-X, IP-Y, chip capacitor, chip resistor, and a chip inductor are mounted on the silicon wiring substrate 100. Pad electrodes formed on each of the bare-chip IPs and pad electrodes formed on the silicon wiring substrate are bonded together. Then, a region of the upper surface of the silicon wiring substrate and the bare-chip IPs are molded together with a resin encapsulant.

In this case, the size, shape, material and pitch, for example, of the pad electrodes formed on the bare-chip IPs such as the chip capacitor, chip resistor, and chip inductor are preferably the same as those of the pad electrodes of other bare-chip IPs. Then, as in the bare-chip IPs 1 through 6, the mounting cost for making a module and the cost of patterning the silicon wiring substrate can be reduced.

Besides, the bare-chip IPs are not mounted on the silicon wiring substrate after molded with, for example, a resin encapsulant. Instead, the bare-chip IPs are mounted on the silicon wiring substrate before being molded with a resin encapsulant as shown in FIG. 4. As a result, the inventive mounting process can be simplified and the fabricating cost can be reduced, as compared to a mounting process in which the bare-chip IPs are molded together with a resin encapsulant and then mounted on the substrate.

The silicon wiring substrate, which is one of the most preferable embodiments of the present invention, has been herein described as a substrate chip. Alternatively, the silicon wiring substrate may be a normal bare chip. In addition, all of the bare-chip IPs are not necessarily flip-chip bonded to the substrate chip. For example, part of the bare-chip IPs may be wire-bonded to the substrate chip with, for example, fine metal wires or metal ribbons.

A resin adhesive may be interposed between the bare-chip IPs and the silicon wiring substrate with the bare-chip IPs mounted on the substrate and with their pad electrodes connected together via, for example, bumps. In this case, the silicon wiring substrate may be coated with a resin adhesive before the bare-chip IPs are mounted thereon. Alternatively, a resin adhesive may be poured into a gap between each bare-chip IP and the silicon wiring substrate after the pad electrodes of the bare-chip IPs and the pad electrodes of the silicon wiring substrate have been bonded together with, for example, bumps. In such a case, if the bare-chip IPs and the silicon wiring substrate are bonded together with a resin encapsulant as in this embodiment, no resin exists between the bare-chip IPs and the silicon wiring substrate. As a result, a bare-chip IP where contact failure occurs can be advantageously removed from the silicon wiring substrate before the rest of the bare-chip IPs are mounted thereon again.

What is claimed is:

1. A set of small semiconductor chips, which is mounted on a large chip including a plurality of pad electrodes, each of the small semiconductor chips comprising, on its face, a plurality of pad electrodes that are arranged in an array, wherein the pad electrodes of the small semiconductor chips are of a same size and a same shape, arranged at a same pitch, and made of a same material, and wherein the pitch is equal to a pitch between the pad electrodes of the large chip.

2. The set of small semiconductor chips of claim 1, each of the small semiconductor chips further comprising an internal circuit, wherein a part of the pad electrodes of each of the small semiconductor chips is electrically connected to the internal circuit, and wherein at least one of the pad electrodes, other than the part of the pad electrodes, is electrically isolated from the internal circuit in each of the small semiconductor chips.

3. The set of small semiconductor chips of claim 1, wherein the pad electrodes are of a same size and arranged at a same pitch so that the size and the pitch is each standardized to take a discrete value.

4. The set of small semiconductor chips of claim 1, including at least one element selected from the group consisting of a chip capacitor, a chip resistor, and a chip inductor.

5. A large semiconductor chip on which a plurality of small chips, each including a plurality of pad electrodes, are mounted, the large semiconductor chip comprising, on its face, a plurality of pad electrodes that are arranged in an array, wherein the pad electrodes of the large semiconductor chip are of a same size and a same shape, arranged at a same pitch, and made of a same material, and wherein the pitch is equal to a pitch between the pad electrodes of each of the small chips, and wherein the large semiconductor chip is a substrate that is used only for forming interconnects and includes no semiconductor element.

6. The large semiconductor chip of claim 5, further comprising: a ground layer; a power source layer; at least one wiring layer for transmitting signals; a pad electrode layer where the pad electrodes are arranged; and a semiconductor substrate, the ground, power source, wiring, and pad electrode layers being formed over the semiconductor substrate with an insulating layer each interposed therebetween, and wherein the ground layer is formed over almost the entire surface of the semiconductor substrate.

7. A multichip module comprising: a large chip; and a set of small chips mounted on the large chip, wherein each of the large chip and the small chips includes, on its face, a plurality of pad electrodes that are arranged in an array, and wherein the pad electrodes of the large chip are of a same size and a same shape, arranged at a same pitch, and made of a same material, and wherein the pad electrodes of the small chips are of a same size and a same shape, arranged at a same pitch, and made of a same material, and wherein the pitch is equal to a pitch between the pad electrodes of the large chip.

8. The multichip module of claim 7, wherein each of the small chips includes an internal circuit, and wherein a part of the pad electrodes is electrically connected to the internal circuit in each of the small chips, and wherein at least one of the pad electrodes, other than the part of the pad electrodes, is electrically isolated from the internal circuit in each of the small chips.

9. The multichip module of claim 7, wherein the pad electrodes of the large chip and the small chips are of a same size and arranged at a same pitch so that the size and the pitch is each standardized to take a discrete value.

10. The multichip module of claim 7, wherein the large chip is a substrate that is used only for forming interconnects and includes no semiconductor element.

11. The multichip module of claim 7, wherein the large chip further includes: a ground layer; a power source layer; at least one wiring layer for transmitting signals; a pad electrode layer where the pad electrodes are arranged; and a semiconductor substrate, the ground, power source, wiring, and pad electrode layers being formed over the semiconductor substrate with an insulating layer each interposed therebetween, and wherein the ground layer is formed over almost the entire surface of the semiconductor substrate.

12. The multichip module of claim 7, wherein the set of small chips includes at least one element selected from the group consisting of a chip capacitor, a chip resistor, and a chip inductor.

* * * * *